US012777659B2

(12) United States Patent
Mun et al.

(10) Patent No.: US 12,777,659 B2
(45) Date of Patent: Oct. 27, 2026

(54) STACK-TYPE SEMICONDUCTOR PACKAGE

(71) Applicant: SAMSUNG ELECTRONICS CO., LTD., Suwon-si (KR)

(72) Inventors: Kyung Don Mun, Suwon-si (KR); Jongyoun Kim, Suwon-si (KR); Jaegwon Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 659 days.

(21) Appl. No.: 18/165,412

(22) Filed: Feb. 7, 2023

(65) Prior Publication Data

US 2023/0422521 A1 Dec. 28, 2023

(30) Foreign Application Priority Data

Jun. 27, 2022 (KR) ........................ 10-2022-0078495

(51) Int. Cl.
*H10B 80/00* (2026.01)

(52) U.S. Cl.
CPC .................................... *H10B 80/00* (2023.02)

(58) Field of Classification Search
CPC ..... H10B 80/00; H10B 99/10; H01L 25/0657; H01L 24/20; H01L 24/94; H01L 23/3107;
(Continued)

(56) References Cited

U.S. PATENT DOCUMENTS 10,211,123 B2 2/2019 Son
10,262,699 B2 4/2019 Oh et al.
(Continued)

FOREIGN PATENT DOCUMENTS

KR 10-2021-0072181 A 6/2021
KR 10-2021-0135107 A 11/2021
(Continued)

OTHER PUBLICATIONS

Young-Cheon Kwon et al., 25.4 A 20nm 6GB F tion-In-Memory DRAM, Based on HBM2 with a 1.2TFLOPS Programmable Computing Unit Using Bank-Level Parallelism, for Machine Learning Applications,, 2021 IEEE International Solid-State Circuits Conference, pp. 350-352.
(Continued)

*Primary Examiner* — Timor Karimy
(74) *Attorney, Agent, or Firm* — Morgan, Lewis & Bockius LLP

(57) ABSTRACT

A semiconductor package includes a buffer die. One or more first semiconductor dies are stacked on the buffer die such that active surfaces face the buffer die. A second semiconductor die is stacked on the first semiconductor dies. The second semiconductor die includes a first layer and a second layer disposed thereon. The first layer includes a first semiconductor substrate. First memory blocks are disposed on the first semiconductor substrate. A first penetration electrode vertically penetrates the first semiconductor substrate and is connected to the first memory blocks. The second layer includes a second semiconductor substrate and computing blocks disposed on the second semiconductor substrate. The first and second layers have active surfaces in contact with each other. The first memory block aid the computing block have first and second pads, respectively, in contact with each other.

13 Claims, 11 Drawing Sheets

(58) Field of Classification Search
CPC ............. H01L 2224/94; H01L 2224/21; H01L 2225/06458; H01L 2225/06572; H01L 2225/06586
See application file for complete search history.

(56) References Cited

U.S. PATENT DOCUMENTS

| | | | | |
|---|---|---|---|---|
| 11,094,371 | B2 | 8/2021 | O et al. | |
| 11,276,459 | B2 | 3/2022 | O | |
| 11,551,996 | B2 | 1/2023 | Choi | |
| 11,721,604 | B2 * | 8/2023 | Choi | H01L 23/5384 257/737 |
| 11,810,900 | B2 | 11/2023 | Jung et al. | |
| 2021/0050347 | A1 | 2/2021 | Brewer | |
| 2021/0217734 | A1 * | 7/2021 | Li | H01L 25/18 |
| 2021/0224195 | A1 | 7/2021 | O | |
| 2021/0225413 | A1 * | 7/2021 | Shibata | G11C 11/4072 |
| 2021/0366874 | A1 | 11/2021 | Choi | |
| 2022/0083260 | A1 | 3/2022 | Lee et al. | |
| 2022/0093200 | A1 | 3/2022 | Kim et al. | |

FOREIGN PATENT DOCUMENTS

| | | | |
|---|---|---|---|
| KR | 10-2022-0008093 | A | 1/2022 |
| KR | 10-2022-0048695 | A | 4/2022 |

OTHER PUBLICATIONS

Office Action dated Mar. 18, 2025 issued in corresponding Korean Patent Application No. 10-2022-0078495.

* cited by examiner

STACK-TYPE SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0078495, filed on Jun. 27, 2022, in the Korean Intellectual Property Office, the entire contents of which as hereby incorporated in reference.

TECHNICAL FIELD

The present disclosure relates to a semiconductor package, and in particular, to a stack-type semiconductor package.

DISCUSSION OF THE RELATED ART

A semiconductor package is a casing containing, an integrated-circuit chip that protects the chip from damage and allows for it to be easily used as a part of an electronic product. Conventionally, the semiconductor package includes a printed circuit board (PCB) and a semiconductor chip die, which is mounted on the PCB and is electrically connected to the PCB using bonding wires or bumps. With the development of the electronics industry, many studies are being conducted to increase reliability and durability of the semiconductor package.

A semiconductor package includes a buffer die, first semiconductor dies stacked on the buffer die such that active surfaces thereof face the buffer die, and a second semiconductor die stacked on the first semiconductor dies. The second semiconductor die includes a first layer and a second layer disposed on the first layer. The first layer includes a first semiconductor substrate, a plurality of first memory blocks disposed on a surface of the first semiconductor substrate, and a first penetration electrode vertically penetrating the first semiconductor substrate and connected to the first memory blocks. The second layer includes a second semiconductor substrate and a plurality of computing blocks disposed on a surface of the second semiconductor substrate. An active surface of the first layer and an active surface of the second layer are in contact with each other, and a first pad of the first memory block and a second pad of the computing block are in contact with each other.

A semiconductor package includes a buffer die, first semiconductor dies stacked on the buffer die, each of the first semiconductor dies including a plurality of first memory blocks, and a second semiconductor die stacked on the first semiconductor dies. The second semiconductor die includes a first layer including a first semiconductor substrate and a plurality of second memory blocks disposed on a top surface of the first semiconductor substrate, second layers disposed on the first layer, each of the second layers including a second semiconductor substrate and a plurality of computing blocks disposed on a bottom surface of the second semiconductor substrate, and a heat dissipation element disposed on the first layer and filling a space between the second layers. An active surface of the first layer is in contact with an active surface of the second layer.

A semiconductor package includes a buffer die, first semiconductor dies stacked on the buffer die, each of the first semiconductor dies including a plurality of first memory blocks and having a first penetration electrode vertically penetrating the first semiconductor dies, and a second semiconductor die stacked on the first semiconductor dies. The second semiconductor die includes a first semiconductor substrate, a plurality of second memory blocks disposed on a top surface of the first semiconductor substrate, a second semiconductor substrate disposed on the first semiconductor substrate, a plurality of computing blocks disposed on a bottom surface of the second semiconductor substrate, and a second penetration electrode vertically penetrating the first semiconductor substrate and connected to the second memory blocks and/or the computing blocks. A first pad of the second memory block and a second pad of the computing block are directly connected to each other, and the first semiconductor dies are electrically connected to each other through a connection terminal disposed therebetween.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Example embodiments of the inventive concepts will now be described more fully with reference to the accompanying drawings, in which example embodiments are shown.

Figure 1:
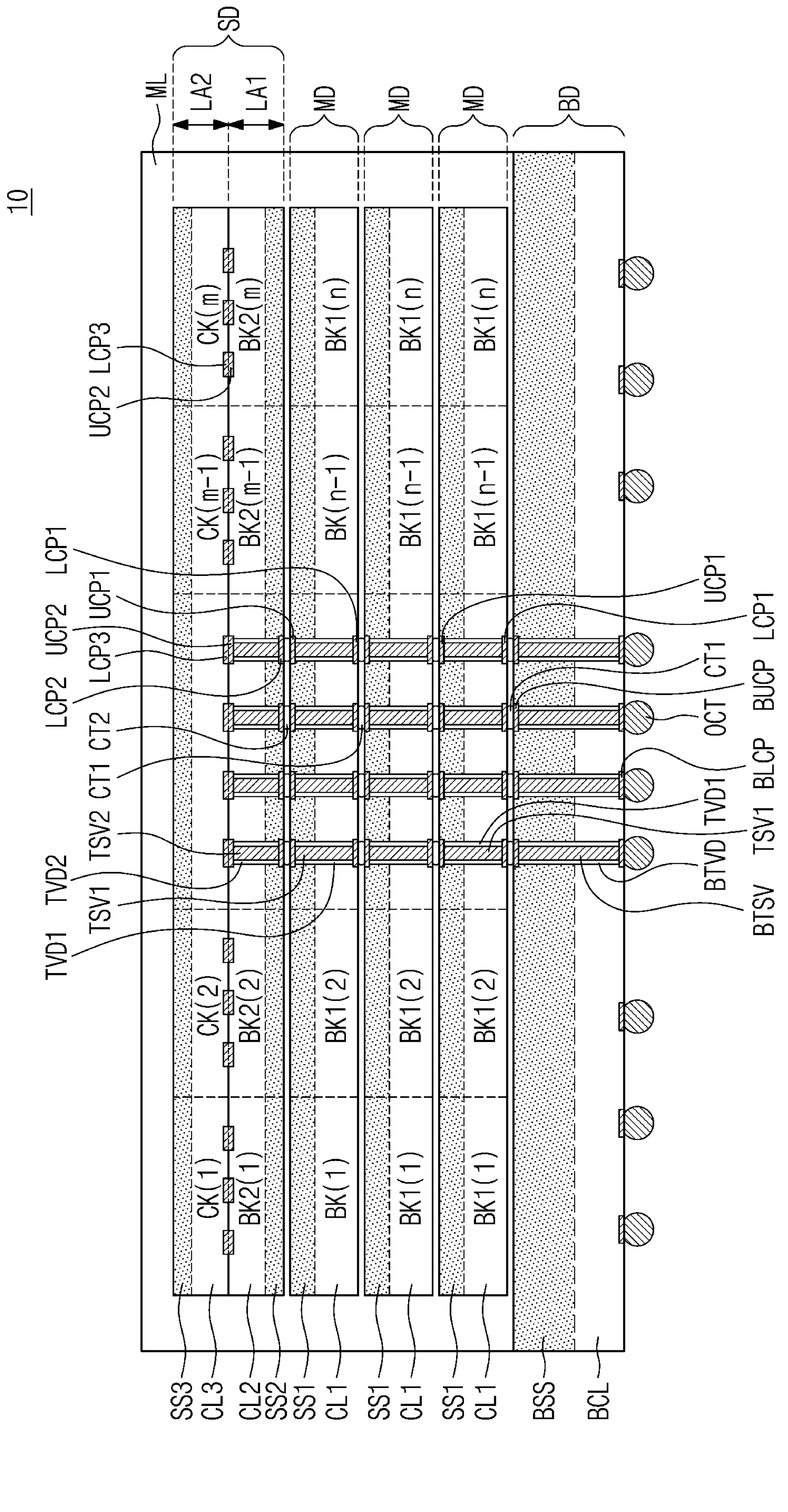
FIGS. 1 to 3 are cross-sectional views, each of which illustrates a semiconductor package according to an embodiment of the inventive concept.
Figure 2:
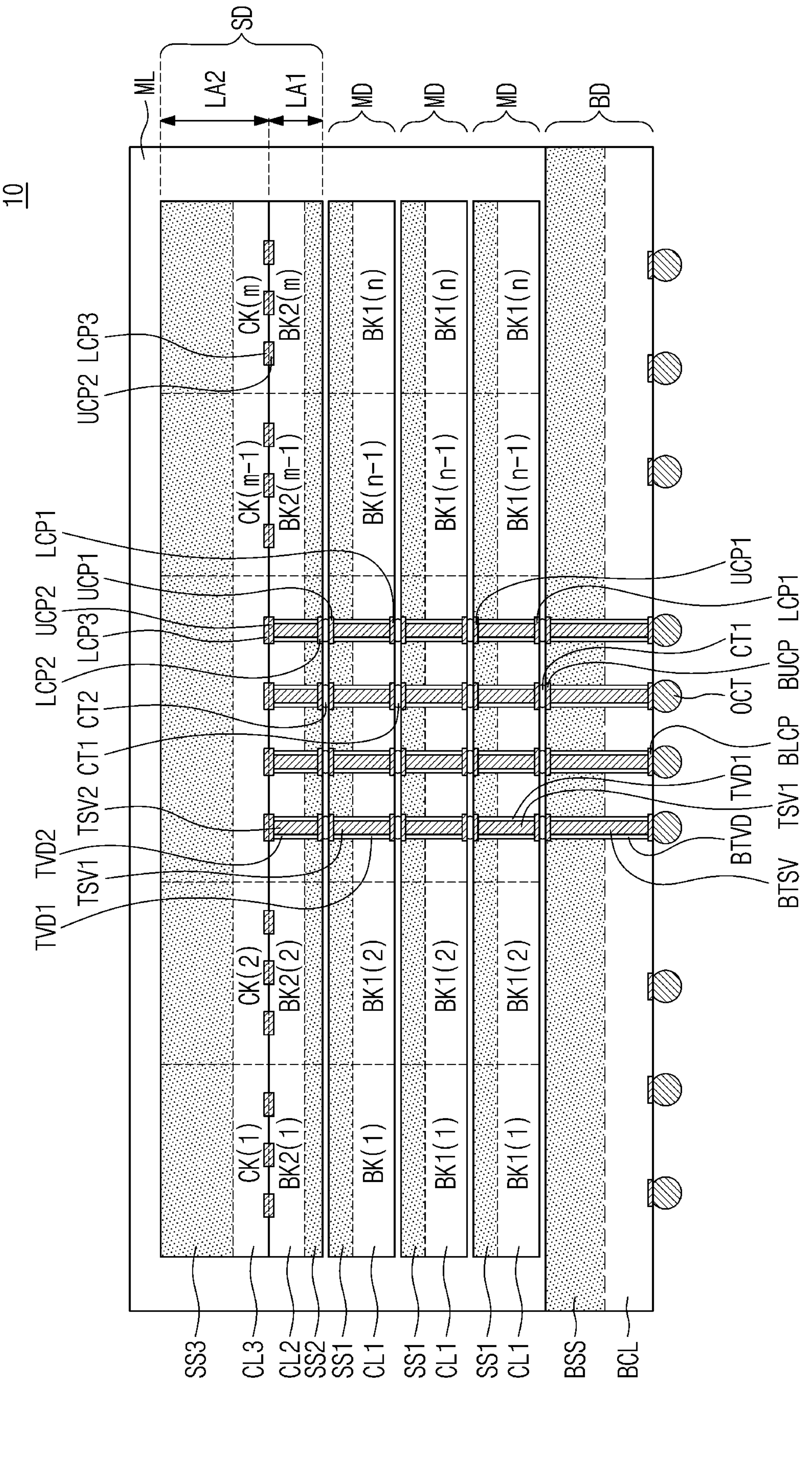

FIGS. 1 and 2 are cross-sectional views, each of which illustrates a semiconductor package according to an embodiment of the inventive concept.

Referring to FIG. 1, a semiconductor package 10 may include a buffer die BD, one or more memory dies MD stacked on the buffer die BD, and a semiconductor die SD disposed on the memory dies MD.

The buffer die BD may be a base die including a semiconductor device. Alternatively, the buffer die BD may be referred to as an interface die, a logic die, or a master die. The buffer die BD may be used as an interface circuit disposed between the memory and semiconductor dies MD and SD, on one side, and an external controller, on the other side. The buffer die BD may receive commands, data, and/or signals, which are transmitted from the external controller, and to transmit the received commands, data, and/or signals, to the memory and semiconductor dies MD and SD through penetration vias BTSV, TSV1, and TSV2. The buffer die BD may transmit data, which are output from the memory and semiconductor dies MD and SD, to the external controller. The buffer die BD may include a physical layer, buffering circuits, and or interface circuits, which are used to receive and amplify the above signals.

A bottom surface of the buffer die BD may be an active surface. For example, the buffer die BD may be disposed in a face-down manner. The buffer die BD may include a base semiconductor substrate BSS, a base circuit layer BCL, and base penetration electrodes BTSV.

The base semiconductor substrate BSS may be a wafer level semiconductor substrate, which is formed of a semiconductor material (e.g., silicon (Si)). For example, the base semiconductor substrate BSS may be a single-crystalline semiconductor substrate or a silicon-on-insulator (SOI) substrate.

The base circuit layer BCL may be disposed on a bottom surface of the base semiconductor substrate BSS. The base circuit layer BCL may include an integrated circuit. For example, the base circuit layer BCL may include transistors, which are formed on the bottom surface of the base semiconductor substrate BSS, internal wires or passive devices, which are connected to the transistors, and an interlayer insulating layer, which is disposed on the bottom surface of the base semiconductor substrate BSS and may cover the transistors, the internal wires, or the passive devices. The interlayer insulating layer may be formed of or may include at least one of silicon oxide (SiO), silicon nitride (SiN), silicon oxynitride (SiON), porous insulating materials and may have a single- or multi-layered structure. In an embodiment, the base circuit layer BCL may be a memory circuit. For example, the buffer die BD may be a memory chip (e.g., DRAM, SRAM, MRAM or FLASH memory chips). However, the inventive concept is not necessarily limited to this example.

The base penetration electrodes BTSV may penetrate the buffer die BD in a direction perpendicular to the buffer die BD. The base penetration electrodes BTSV and the base circuit layer BCL may be electrically connected to each other. The base penetration electrodes BTSV may be formed of or may include at least one of metallic materials (e.g., copper (Cu), aluminum (Al), or tungsten (W)). The base penetration electrodes BTSV may be spaced apart from the base semiconductor substrate BSS by a base via insulating layer BTVD. The base via insulating layer BTVD may be formed of or may include at least one a silicon oxide (SiO), silicon nitride (SiN), or silicon oxynitride (SiON) and may have a single- or multi-layered structure. Alternatively, the base via insulating layer BTVD may include an air gap region.

Base lower conductive pads BLCP may be disposed at a lower level of the buffer die BD. Base upper conductive pads BUCP may be disposed at an upper level of the buffer die BD. The base lower conductive pads BLCP may be in contact with or overlapped with the base penetration electrodes BTSV. Alternatively, some of the base lower conductive pads BLCP, which are located in a region without the base penetration electrodes BTSV, may be disposed at the lower level of the buffer die BD. The base upper conductive pads BUCP may be in contact with or overlapped with the base penetration electrodes BTSV. The base lower conductive pads BLCP and the base upper conductive pads BUCP may be formed of or ma include at least one of metallic materials (e.g., copper (Cu), gold (Au), nickel (Ni), tin (Sn), silver (Ag), tungsten (W), and aluminum (Al)).

The buffer die BD may further include a protection layer. The protection layer may be disposed on the bottom surface of the buffer die BD and may cover the base circuit layer BCL. The protection layer may be formed of or may include silicon nitride (SiN).

Outer connection terminals OCT may be bonded to some of the base lower conductive pads BLCP of the buffer die BD. On the bottom surface of the buffer die BD, the outer connection terminals OCT may be coupled to the base lower conductive pads BLCP. The outer connection terminals OCT may be electrically connected to an input/output circuit (i.e., a memory circuit), a power circuit, or a ground circuit of the base circuit layer BCL. The outer connection terminals OCT may be exposed to the outside of the protection layer. The outer connection terminals OCT may include at least one of copper bumps, copper pillars, or solder balls.

FIG. 1 illustrates an example, in which the buffer die BD is a base die including a semiconductor device, but the inventive concept is not necessarily limited to this example or a specific embodiment. In an embodiment, an interposer substrate or a package substrate may be used in place of the buffer die BD.

The memory die MD may be mounted on the buffer die BD. For example, the memory die MD and the buffer die BD may form a chip-on-water (COW) structure. A width of the memory die MD may be smaller than a width of the buffer die BD.

The memory die MD may be a die including a semiconductor device. A bottom surface of the memory die MD may be an active surface. For example, the memory die MD may be disposed in a face-down manner. The memory die MD may include a first semiconductor substrate SS1, a first circuit layer CL1, and first penetration electrodes TSV1.

The first semiconductor substrate SS1 may be a wafer-level semiconductor substrate, which is formed of a semiconductor material (e.g., silicon (Si)). For example, the first semiconductor substrate SS1 may be a single-crystalline semiconductor substrate or a silicon-on-insulator (SOI) substrate.

The first circuit layer CL1 may be disposed on a bottom surface of the first semiconductor substrate SS1. The first circuit layer CL1 may include an integrated circuit. For example, the first circuit layer CL1 may include transistors, which are formed on the bottom surface of the first semiconductor substrate SS1, internal wires or passive devices, which are connected to the transistors, and an interlayer insulating layer, which is disposed on the bottom surface of the first semiconductor substrate SS1 and may cover the transistors, the internal wires, or the passive devices. The interlayer insulating layer may be formed of or may include at least one of silicon oxide (SiO), silicon nitride (SiN), silicon oxynitride (SiON), or porous insulating materials and may have a single- or multi-layered structure. The first circuit layer CL1 may include a memory circuit. For example, the memory die MD may be a memory chip (e.g., DRAM, SRAM, MRAM or FLASH memory chips). The memory die MD may include n first memory blocks BK1. The number n may be an integer that is larger than or equal to 4. The first memory blocks BK1 may be two-dimensionally arranged on the bottom surface of the first semiconductor substrate SS1 of the memory die MD. The first circuit layer CL1 may include the same circuit as the base circuit layer BCL, but the inventive concept is not necessarily limited to this example.

The first penetration electrodes TSV1 may penetrate the memory die MD in a direction perpendicular to the memory die MD. The first penetration electrodes TSV1 and the first circuit layer CL1 may be electrically connected to each other. The first penetration electrodes TSV1 may be formed of or may include at least one of metallic materials (e.g., copper (Cu), aluminum (Al), or tungsten (W)). The first penetration electrodes TSV1 may be spaced apart from the first semiconductor substrate SS1 by a first via insulating layer TVD1. The first via insulating layer TVD1 may be formed of or may include at least one of silicon oxide (SiO), silicon nitride (SiN), or silicon oxynitride (SiON) and may have a single- or multi-layered structure. Alternatively, the first via insulating layer TVD1 may include an air gap region.

First lower conductive pads LCP1 may be disposed at a lower level of the memory die MD. First upper conductive pads UCP1 may be disposed at an upper level of the memory die MD. The first lower conductive pads LCP1 may be in contact with or overlapped with the first penetration electrodes TSV1. The first upper conductive pads UCP1 may be in contact with or overlapped with the first penetration electrodes TSV1. The first lower conductive pads LCP1 and the first upper conductive pads UCP1 may be formed of or may include at least one of metallic materials (e.g., copper (Cu), gold (Au), nickel (Ni), tin (Sn), silver (Ag), tungsten (W), and aluminum (Al)).

The memory die MD may further include a protection layer. The protection layer may be disposed on the bottom surface of the memory die MD and may cover the first circuit layer CL1. The protection layer may be formed of or may include silicon nitride (SiN).

First die bumps CT1 may be disposed on the bottom surface of the memory die MD. The first die bumps CT1 on the bottom surface of the memory die MD may be coupled to the first lower conductive pads LCP1. The first die bumps CT1 may be electrically connected to an input/output circuit (e.g., a memory circuit), a power circuit, or a ground circuit of the first circuit layer CL1. The first die bumps CT1 may be exposed to the outside of the protection layer. The first die bumps CT1 between the buffer die BD and the memory die MD may electrically connect the buffer die BD and the memory die MD to each other. For example, the first die bumps CT1 may connect the first lower conductive pads LCP1 of the memory die MD to the base upper conductive pads BUCP of the buffer die BD.

In an embodiment, there may be a plurality of the memory dies MD. For example, a plurality of the memory dies MD may be stacked on the buffer die BD. The first die bumps CT1 may be respectively disposed between the memory dies MD. For example, the first die bumps CT1 may connect the first upper conductive pads UCP1 of one of the memory dies MD to the first upper conductive pads LCP1 of another memory die MD thereon.

The semiconductor die SD may be mounted on the memory dies MD. A width of the semiconductor die SD may be equal or similar to widths of the memory dies MD. The semiconductor die SD may include a first layer LA1, in which second memory blocks BK2 are disposed, and a second layer LA2, in which computing blocks CK are disposed. For example, the semiconductor die SD may be a processing-in-memory (PIM) chip having both of a storage or memory function and a computing or processing function. The total number of the memory and semiconductor dies MD and SD, which are stacked on the buffer die BD, may range from 8 to 32.

The first layer LA1 may include a second semiconductor substrate SS2, a second circuit layer CL2, and second penetration electrodes TSV2.

The second semiconductor substrate SS2 may be a wafer-level semiconductor substrate, which is formed of a semiconductor material (e.g., silicon (Si)). For example, the second semiconductor substrate SS2 may be a single-crystalline semiconductor substrate or a silicon-on-insulator (SOI) substrate.

The second circuit layer CL2 may be disposed on a top surface of the second semiconductor substrate SS2. For example, a top surface of the first layer LA1 may be an active surface. The second circuit layer CL2 may include an integrated circuit. For example, the second circuit layer CL2 may include transistors, which are formed on the top surface of the second semiconductor substrate SS2, internal wires or passive devices, which are connected to the transistors, and an interlayer insulating layer, which is disposed on the top surface of the second semiconductor substrate SS2 and may cover the transistors, the internal wires, or the passive devices. The interlayer insulating layer may be formed of or may include at least one of silicon oxide (SiO), silicon nitride (SiN), silicon oxynitride (SiON), porous insulating materials and may have a single- or multi-layered structure. The second circuit layer CL2 may include a memory circuit. For example, the first layer LA1 may be a part of the semiconductor die SD serving memory element. The first layer LA1 may include in second memory blocks BK2. The number m may be an integer that is larger than or equal to 4. Each of the second memory blocks BK2 may be referred to as a 'BANK'. The second memory blocks BK2 may be two-dimensionally arranged on the top surface of the second semiconductor substrate SS2 of the first layer LA1.

The second penetration electrodes TSV2 may penetrate the first layer LA1 in a direction perpendicular to the first layer LA1. The second penetration electrodes TSV2 and the second circuit layer CL2 may be electrically connected to each other. The second penetration electrodes TSV2 may be formed of or may include at least one of metallic materials (e.g., copper (Cu), aluminum (Al), or tungsten (W)). The second penetration electrodes TSV2 may be spaced apart from the second semiconductor substrate SS2 by a second via insulating layer TVD2. The second via insulating layer TVD2 may be formed of or ma include at least one of silicon oxide (SiO), silicon nitride (SiN), or silicon oxynitride (SiON) and may have a single- or multi-layered structure. Alternatively, the second via insulating layer TVD2 may include an air gap region.

Second lower conductive pads LCP2 may be disposed at a lower level of the first layer LA1. Second upper conductive pads UCP2 may be disposed at an upper level of the first layer LA1. The second lower conductive pads LCP2 may be in contact with or overlapped with the second penetration electrodes TSV2. Some of the second upper conductive pads UCP2 may be in contact with or overlapped with the second penetration electrodes TSV2. Others of the second upper conductive pads UCP2, which are located in a region without the second penetration electrodes TSV2, may be disposed at the upper level of the first layer LA1. For example, some of the second upper conductive pads UCP2 may be used to connect the semiconductor die SD to the memory dies MD through the second penetration electrodes TSV2, and others of the second upper conductive pads UCP2 may be used to connect the first layer LA1 to the second layer LA2, which will be described below. Top surfaces of the second upper conductive pads UCP2 may be coplanar with a top surface of the second circuit layer CL2. The second lower conductive pads LCP2 and the second upper conductive pads UCP2 may be formed of or may include at least one of metallic materials (e.g., copper (Cu), gold (Au), nickel (Ni), tin (Sn), silver (Ag), tungsten (W), and aluminum (Al)).

In an embodiment, the first layer LA1 may further include a protection layer. The protection layer may be disposed on the top surface of the first layer LA1 and may cover the second circuit layer CL2. In this case, a top surface of the second upper conductive pads UCP2 may be coplanar with a top surface of the protection layer. The protection layer may be formed of or may include silicon nitride (SiN).

The second layer LA2 may be disposed on the fast layer LA1. A width of the second layer LA2 may be equal to a width of the first layer LA1. The second layer LA2 may include a third semiconductor substrate SS3 and a third circuit layer CL3.

The third semiconductor substrate SS3 may be a wafer-level semiconductor substrate, which is formed of a semiconductor material (e.g., silicon (Si)). For example, the third semiconductor substrate SS3 may be a single-crystalline semiconductor substrate or a silicon-on-insulator (SOI) substrate. A width of the third semiconductor substrate SS3 may be equal to a width of the second semiconductor substrate SS2.

The third circuit layer CL3 may be disposed on a bottom surface of the third semiconductor substrate SS3. For example, a bottom surface of the second layer LA2 may be an active surface. The third circuit layer CL3 may include an integrated circuit. For example, the third circuit layer CL3 may include transistors, which are formed on the bottom surface of the third semiconductor substrate SS3, internal wires or passive devices, which are connected to the transistors, and an interlayer insulating layer, which is disposed on the bottom surface of the third semiconductor substrate SS3 and may cover the transistors, the internal wires, or the passive devices. The interlayer insulating layer may be formed of or may include at least one of silicon oxide (SiO), silicon nitride (SiN), silicon oxynitride (SiON), porous insulating materials and may have a single- or multi-layered structure. The third circuit layer CL3 may include a logic circuit. For example, the second layer LA2 may be a part of the semiconductor die SD serving as a processor. The second layer LA2 may include m computing blocks CK. The number m may be an integer that is larger than or equal to 4. The computing blocks CK may include one or more computing units. The computing units may perform specific operations, such as max pooling, rectified linear unit (ReLU), channel-wise addition operations. The computing blocks CK may be two-dimensionally arranged on the bottom surface of the third semiconductor substrate SS3 of the second layer LA2. The computing blocks CK of the second layer LA2 may be respectively overlapped with the second memory blocks BK2 of the first layer LA1.

Third lower conductive pads LCP3 may be disposed at a lower level of the second layer LA2. Positions of the third lower conductive pads LCP3 may vertically correspond to positions of the second upper conductive pads UCP2. Some of the third lower conductive pads LCP3 may be overlapped with the second penetration electrodes TSV2. Others of the third lower conductive pads LCP3, which are located in a region without the second penetration electrodes TSV2, may be disposed at the lower level of the second layer LA2. For example, some of the third lower conductive pads LCP3 may be used to connect the semiconductor die SD to the memory dies MD through the second penetration electrodes TSV2, and others of the third lower conductive pads LCP3 may be used to connect the first layer LA1 to the second layer LA2. Bottom surfaces of the third lower conductive pads LCP3 may be coplanar with a bottom surface of the third circuit layer CL3. The third lower conductive pads LCP3 may be formed of or may include at least one of metallic materials (e.g., copper (Cu), gold (Au), nickel (Ni), tin (Sn), silver (Ag), tungsten (W), and aluminum (Al)).

In an embodiment, the second layer LA2 may further include a protection layer. The protection layer may be disposed on the bottom surface of the second layer LA2 and may cover the third circuit layer CL3. In this case, bottom surfaces of the third lower conductive pads LCP3 may be coplanar with a bottom surface of the protection layer. The protection layer may be formed of or may include silicon nitride (SiN).

The second layer LA2 may be bonded to the first layer LA1. The active surface of the first layer LA1 may be in contact with the active surface of the second layer LA2. Here, the first and second lavers LA1 and LA2 may form a hybrid bonding structure. In the present specification, the hybrid bonding structure may mean a bonding structure, in which two materials of the same kind are fused at an interface therebetween. For example, the second upper conductive pads UCP2 of the first layer LA1 and the third lower conductive pads LCP3 of the second layer LA2 may form a continuous structure, and thus, there may be no observable interface between the second upper conductive pads UCP2 and the third lower conductive pads LCP3. For example, since, at a boundary between the second circuit layer CL2 of the first layer LA1 and the third circuit layer CL3 of the second layer LA2, the second upper conductive pads UCP2 and the third lower conductive pads LCP3, which are in contact with each other, are formed of the same material, any interface may be absent between the second upper conductive pads UCP2 and the third lower conductive pads LCP3. For example, the second upper conductive pads UCP2 and the third lower conductive pads LCP3 may together be a single element. Accordingly, the second upper conductive pads UCP2 and the third lower conductive pads LCP3 may form a continuous structure. The first and second layers LA1 and LA2 may be electrically connected to each other through the second upper conductive pads UCP2 and the third lower conductive pads LCP3. The second lower conductive pad LCP2 of the first layer LA1 may be electrically connected to the second layer LA2 through the second penetration electrodes TSV2, the second upper conductive pads UCP2, and the third lower conductive pads LCP3. As an example, the second memory blocks BK2 and the computing blocks CK may be connected to the second lower conductive pads LCP2, which are placed below the first layer LA1, through the second penetration electrodes TSV2. The first and second layers LA1 and LA2 may be bonded to each other to form a single semiconductor die SD.

The second memory blocks BK2 of the first layer LA1 may be respectively overlapped with the computing blocks CK of the second layer LA2. The computing blocks CK of the second layer LA2 may process data, which are received from the second memory blocks BK2 of the first layer LA1, and then to store the results in respective ones of the second memory blocks BK2 of the first layer LA1. The computing blocks CK of the second layer LA2 may be respectively connected to the second memory blocks BK2 of the first layer LA1 through the second upper conductive pads UCP2 and the third lower conductive pads LCP3. For example, data, which are generated in the first one of the second memory blocks BK2(1) of the first layer LA1, may be delivered to the first one of the computing blocks CK(1) of the second layer LA2 through the second upper conductive pads UCP2 and the third lower conductive pads LCP3, which are disposed on the first one of the second memory blocks BK2(1), and may be processed in the computing blocks CK(1) and then, the processed data may be stored in the first one of the second memory blocks BK2(1) of the first layer LA1 through the second upper conductive pads UCP2 and the third lower conductive pads LCP3 thereunder.

In an embodiment, the first layer LA1 serving as the memory element and the second layer LA2 serving as the processor element may have active surfaces that are in contact with each other; for example, the first layer LA1 and the second layer LA2 may be directly connected to each other without any additional connection terminal therebetween. In particular, the second memory blocks BK2 of the first layer LA1 may be directly connected to the computing blocks CK of the second layer LA2 at their corresponding positions. Thus, it may be possible to reduce lengths of signal transmission paths between the second memory blocks BK2 of the first layer LA1 and the computing blocks CK of the second layer LA2 and thereby to increase process and operation speeds of the semiconductor die SD.

Heat, which is generated during an operation of the semiconductor package, may be more in a logic circuit than in a memory circuit. According to an embodiment of the inventive concept, since the semiconductor die SD is placed on the memory dies MD and, in particular, the second layer LA2, which is used as a processor in the semiconductor die SD, is placed on the first layer LA1 serving as a memory element, heat, which is generated in the computing blocks CK of the second layer LA2, may be easily dissipated to the outside through the third semiconductor substrate SS3. Accordingly, it may be possible to realize a semiconductor package with an increased ability to dissipate heat.

FIG. 1 illustrates an example in which the second semiconductor substrate SS2 of the first layer LA1 has the same thickness as the third semiconductor substrate SS3 of the second layer LA2, but the inventive concept is not necessarily limited to this example. In an embodiment, as shown in FIG. 2, a thickness of the third semiconductor substrate SS3 of the second layer LA2 may be larger than a thickness of the second semiconductor substrate SS2 of the first layer LA1. The thickness of the third semiconductor substrate SS3 of the second layer LA2 may be larger than a thickness of the first semiconductor substrate SS1 of the memory dies MD. Since the third semiconductor substrate SS3 is formed of silicon (Si) of high thermal conductivity, heat, which is generated in the second layer LA2, may be more easily dissipated to the outside through the third semiconductor substrate SS3.

Second die bumps CT2 may be disposed on a bottom surface of the semiconductor die SD. The second die bumps CT2 on the bottom surface of the semiconductor die SD may be coupled to the second lower conductive pads LCP2 of the first layer LA1. The second die bumps CT2 may be electrically connected to an input/output circuit (i.e., a memory circuit) of the second circuit layer CL2, an input/output circuit (i.e., a logic circuit) of the third circuit layer CL3, and power or ground circuits of the second and third circuit layers CL2 and CL3. The second die bumps CT2 between the uppermost memory die MD and the semiconductor die SD may be used to electrically connect the uppermost memory die MD to the semiconductor die SD. For example, the second die bumps CT2 may connect the second lower conductive pads LCP2 of the semiconductor die SD to the first upper conductive pads UCP1 of the uppermost memory die MD.

A mold layer ML may be disposed on the buffer die BD. The mold layer ML may encapsulate the memory and semiconductor dies MD and SD on the buffer die BD. Here, the mold layer ML may cover a top surface of the semiconductor die SD. Alternatively, unlike the illustrated structure, the mold layer ML may expose at least a portion of the top surface of the semiconductor die SD. For example, the mold layer ML may cover only side surfaces of the memory and semiconductor dies MD and SD. The mold layer ML may be formed of or may include at least or one of insulating resins (e.g., epoxy molding compound (EMC)). The mold layer ML may further include fillers, which are distributed in the insulating resin. In an embodiment, the filler may be formed of or may include silicon oxide (SiOx).

Figure 3:
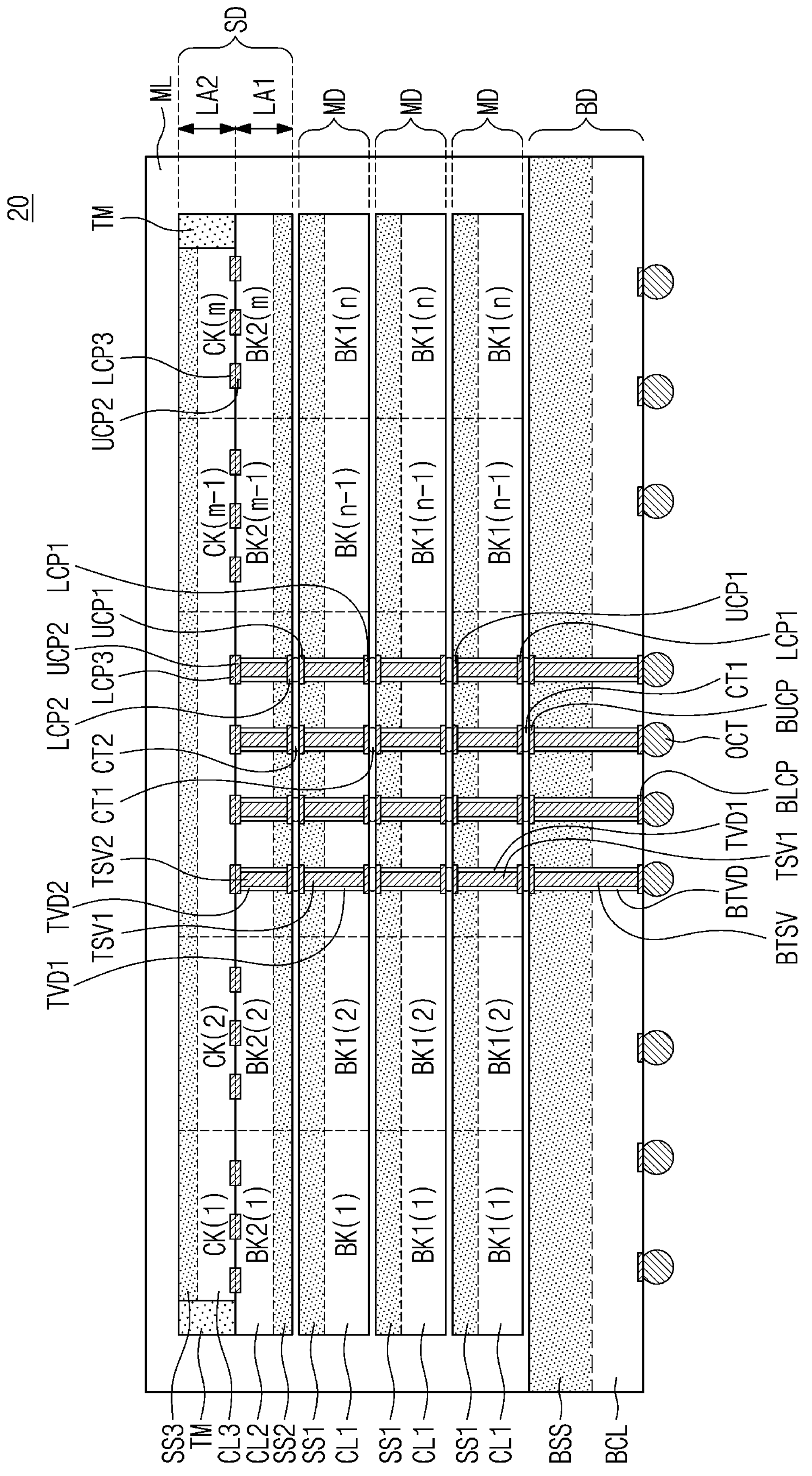
Figure 4:
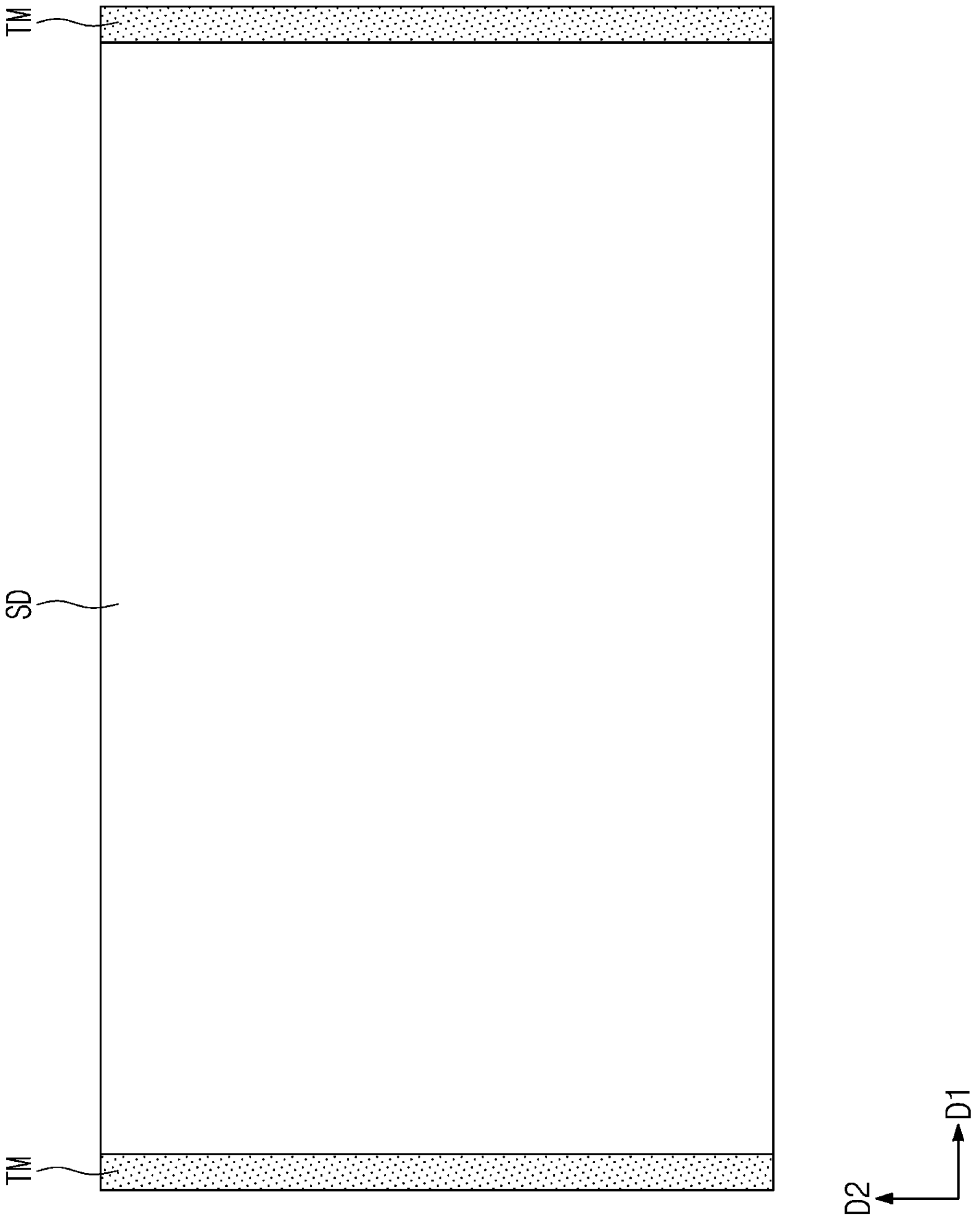
FIGS. 4 and 5 are plan views, each of which illustrates a semiconductor package according to an embodiment of the inventive concept.
Figure 5:
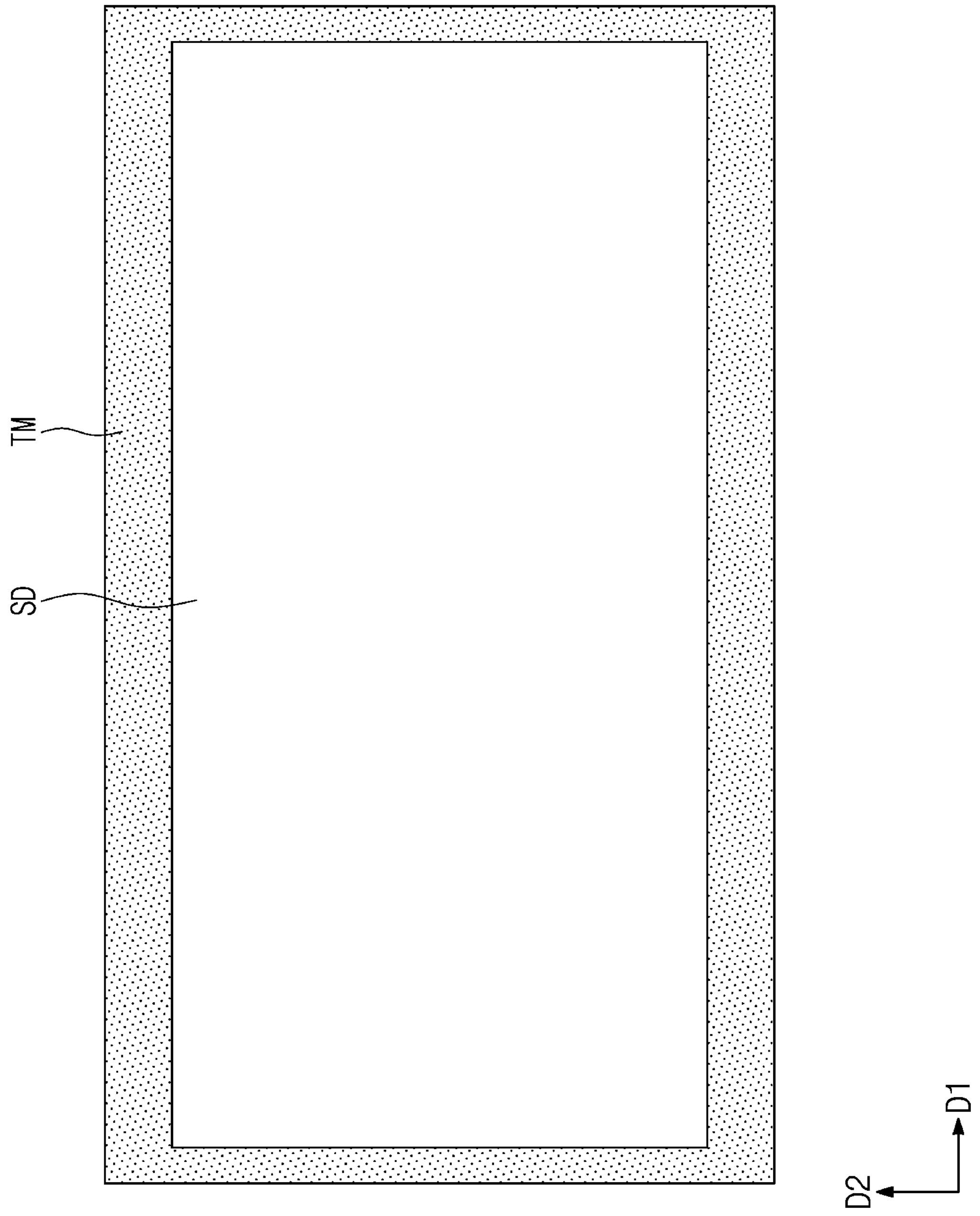

FIG. 3 is a cross-sectional view illustrating a semiconductor package according to an embodiment of the inventive concept. FIGS. 4 and 5 are plan views, each of which illustrates a semiconductor package, according to an embodiment of the inventive concept, and corresponding to top plan views of the semiconductor die and the heat dissipation element. For concise description, an element previously described with reference to FIGS. 1 and 2 may be identified by the same reference number without repeating an overlapping description thereof. For example, technical features different from the embodiments of FIGS. 1 and 2 will be mainly mentioned in the following description of the present embodiment.

Referring to FIG. 3, a width of the second layer LA2 of a semiconductor package 20 may be smaller than a width of the first layer LA1. A heat dissipation element TM may be disposed on the first layer LA1 and at a side of the second layer LA2. As shown in FIG. 4, a width of the second layer LA2 in a first direction D1 may be smaller than that of the first layer LA1, and a width of the second layer LA2 in a second direction D2 may be equal to that of the first layer LA1. For example, when viewed in a plan view, the second layer LA2 may be narrower than the first layer LA1 in only a specific direction (e.g., the first direction D1 in the example of FIG. 4). In this case, the heat dissipation element TM may be disposed exclusively at opposites sides of the second layer LA2 in the first direction D1. Alternatively, as shown in FIG. 5, widths of the second layer LA2 in the first and second directions D1 and D2 may be smaller than those of the first layer LA1. For example, when viewed in a plan view, a planar area of the second layer LA2 may be smaller than a planar area of the first layer LA1. In this case, the heat dissipation element TM may surround the second layer LA2. In an embodiment, the heat dissipation element TM may be disposed at a side of the second layer LA2 in the first direction D1 and at a side of the second layer LA2 in the second direction D2 and might not be disposed at an opposite side of the second layer LA2 in the first direction D1 and at an opposite side of the second layer LA2 in the second direction D2.

Referring hack to FIGS. 3 to 5, a width of the structure including the second layer LA2 and the heat dissipation element TM may be equal to a width of the first layer LA1. A top surface of the heat dissipation element TM may be coplanar with a top surface of the second layer LA2 (i.e., a top surface of the third semiconductor substrate SS3). Alternatively, the heat dissipation element TM may cover the top surface of the second layer LA2. The heat dissipation element TM may be formed of or may include at least one of materials having high thermal conductivities. For example, the heat dissipation element TM may be formed of or may include at least one of silicon compounds or metallic materials. As used herein, high thermal conductivities may be understood as at least the thermal conductivity of silicon compounds or metallic materials.

According to an embodiment of the inventive concept, heat, which is generated in the first and second layers LA1 and LA2, may be dissipated to the outside through not only the third semiconductor substrate SS3 but also the heat dissipation element TM. Accordingly, it may be possible to realize a semiconductor package with increased heat dissipation efficiency. Furthermore, since the heat dissipation element TM surrounds the second layer LA2, the second layer LA2 may be protected from an external impact by the heat dissipation element TM. For example, it may be possible to increase structural stability of the semiconductor package.

Figure 6:
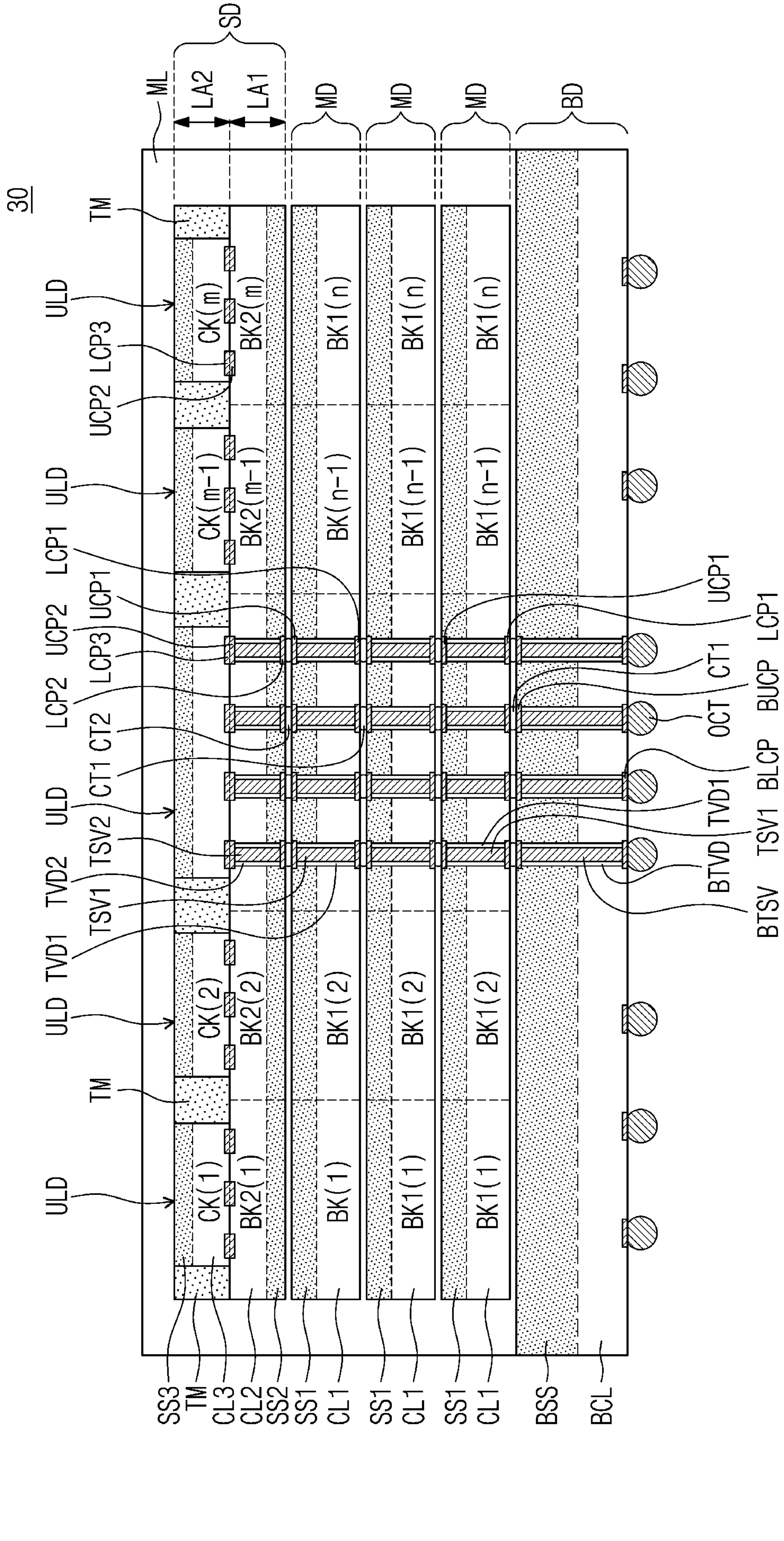
FIG. 6 is a cross-sectional view illustrating a semiconductor package according to an embodiment of the inventive concept.
Figure 7:
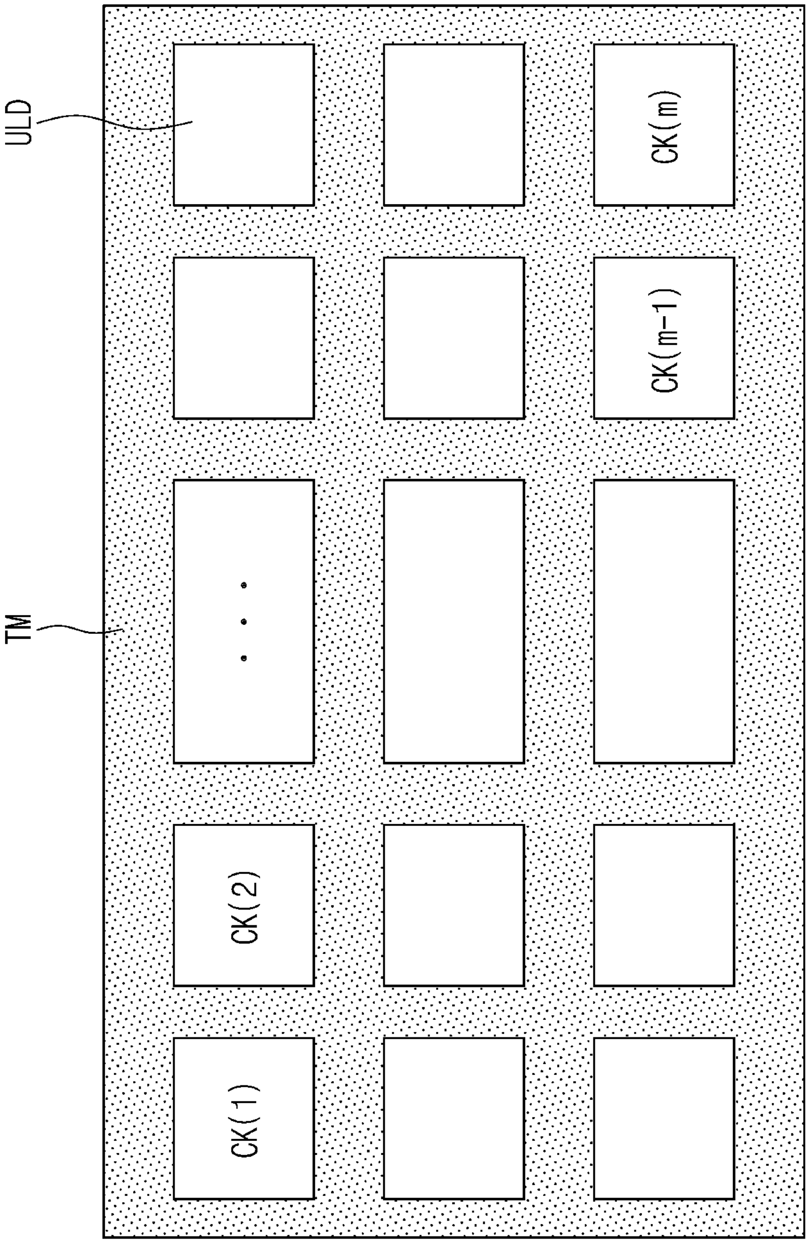
FIG. 7 is a plan view illustrating a semiconductor package according to an embodiment of the inventive concept.

FIG. 6 is a cross-sectional view illustrating a semiconductor package according to an embodiment of the inventive concept. FIG. 7 is a plan view illustrating a semiconductor package, according to an embodiment of the inventive concept, and corresponding to a top plan view of the semiconductor die SD and the heat dissipation element TM.

FIGS. 1 to 5 illustrate examples of the second layer LA2 including the computing blocks CK, which are formed on a single third semiconductor substrate SS3, but the inventive concept is not necessarily limited to this example.

Referring to FIG. 6, the second layer LA2 of a semiconductor package 30 may include a plurality of unit logic dies ULD. Each of the unit logic dies ULD may include the third semiconductor substrate SS3 and the third circuit layer CL3.

The third semiconductor substrate SS3 may be a wafer-level semiconductor substrate, which is formed of a semiconductor material (e.g., silicon (Si)).

The third circuit layer CL3 may be disposed on a bottom surface of the third semiconductor substrate SS3. The third circuit layer CL3 may include an integrated circuit. As an example, the third circuit layer CL3 may include a logic circuit. Each of the unit logic dies ULD may include one or at least two computing blocks CK. The number of the computing blocks CK in all unit logic dies ULD may be equal to the number of the second memory blocks BK2 of the first layer LA1. For example, the number of the computing blocks CK in all unit logic dies ULD may be m. However, the inventive concept is not necessarily limited to this example.

The third lower conductive pads LCP3 may be disposed at a lower level of each of the unit logic dies ULD. Bottom surfaces of the third lower conductive pads LCP3 may be coplanar with a bottom surface of the third circuit layer CL3.

The unit logic dies ULD may be two-dimensionally arranged on a bottom surface of the third semiconductor substrate SS3 of the second layer LA2. The unit logic dies ULD may be respectively overlapped with the second memory blocks BK2 of the first layer LA1. Here, positions of the third lower conductive pads LCP3 of the unit logic dies ULD may vertically correspond to positions of the second upper conductive pads UCP2. The unit logic dies ULD may be spaced apart from each other, when viewed in a plan view.

The second layer LA2 may be bonded to the first layer LA1. The unit logic dies ULD and the first layer LA1 may form the hybrid bonding structure. For example, the second upper conductive pads UCP2 of the first layer LA1 and the third lower conductive pads LCP3 of the unit logic dies ULD may form a continuous structure, and thus, there may be no observable interface between the second upper conductive pads UCP2 and the third lower conductive pads LCP3.

The unit logic dies ULD of the second layer LA2 may be connected to the second memo blocks BK2 of the first layer LA1, respectively. The second memory blocks BK2 of the first layer LA1 may be overlapped with the computing blocks CK of the unit logic dies ULD, respectively. The unit logic dies ULD may process data, which are received from the second memory blocks BK2 of the first layer LA1, and then to store the results in respective ones of the second memory blocks BK2 of the first layer LA1. The unit logic dies ULD may be respectively connected to the second memory blocks BK2 of the first layer LA1 through the second upper conductive pads UCP2 and the third lower conductive pads LCP3. For example, data, which are generated in the first one of the second memory blocks BK2(1) of the first layer LA1, may be delivered to the computing blocks CK(1) of the first one of the unit logic dies ULD through the second upper conductive pads UCP2 and the third lower conductive pads LCP3, which are disposed on the first one of the second memory blocks BK2(1), and may be processed in the computing blocks CK(1), and then, the processed data may be stored in the first one of the second memory blocks BK2(1) of the first layer LA1 through the second upper conductive pads UCP2 and the third lower conductive pads LCP3 thereunder.

The heat dissipation element TM may be disposed on the first layer LA1. The heat dissipation element TM may surround the unit logic dies ULD and to fill a space between the unit logic dies ULD. A width of the structure including the second layer LA2 and the heat dissipation element TM may be equal to a width of the first layer LA1. A top surface of the heat dissipation element TM may be coplanar with a top surface of the second layer LA2 (i.e., a top surface of the third semiconductor substrate SS3). Alternatively, the heat dissipation element TM may cover the top surface of the second layer LA2. The heat dissipation element TM may be formed of or may include at least one of materials having high thermal conductivities.

In an embodiment, the unit logic dies ULD may be disposed such that each of them includes the computing block CK, and the heat dissipation element TM may surround the unit logic dies ULD. Heat, which is generated in each of the computing blocks CK, may be more easily dissipated to the outside through the heat dissipation element TM. Accordingly, it may be possible to realize a semiconductor package with increased heat dissipation efficiency.

Figure 8:
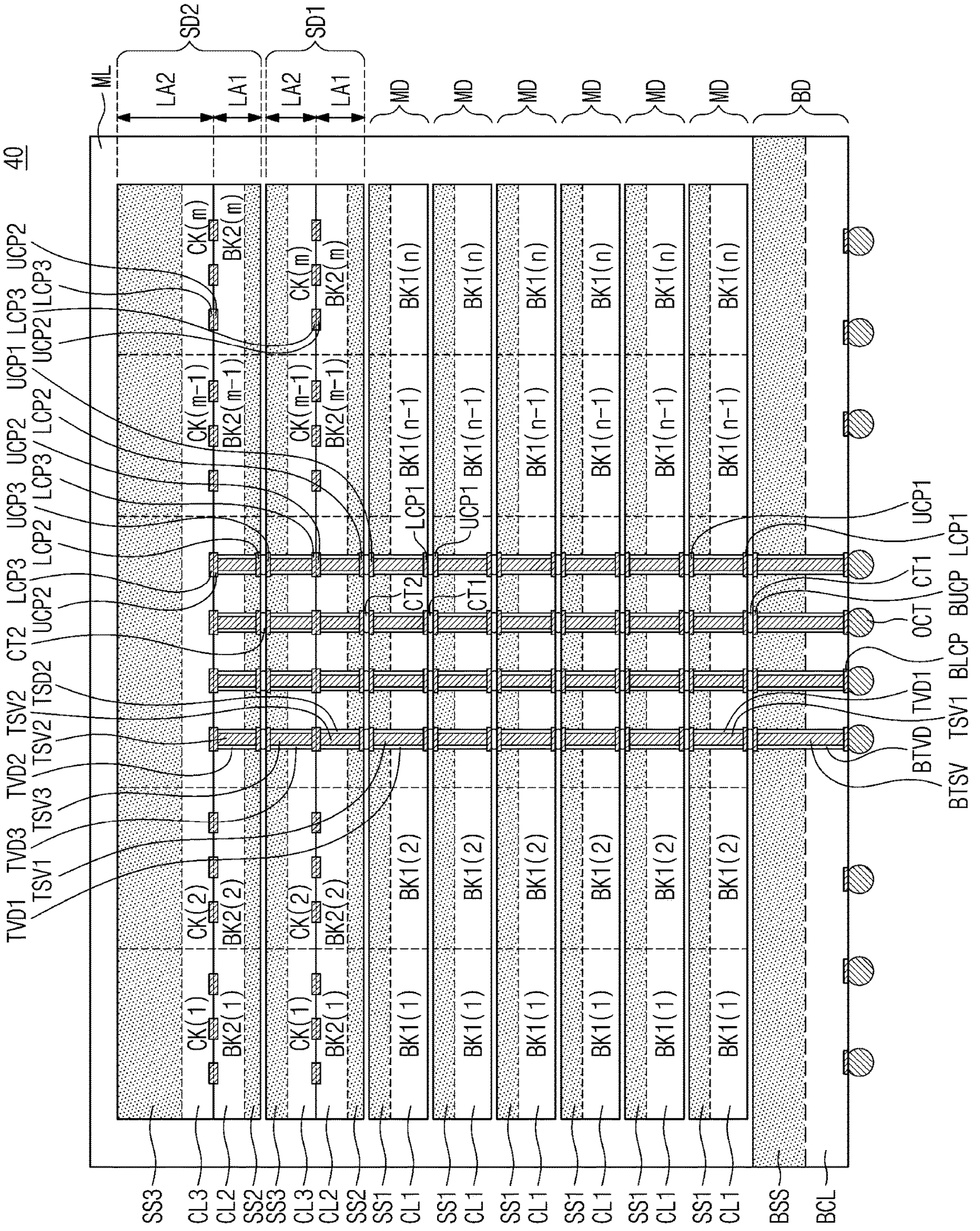
FIGS. 8 to 11 are cross-sectional views, each of which illustrates a semiconductor package according to an embodiment of the inventive concept.

FIG. 8 is a cross-sectional view illustrating a semiconductor package according to an embodiment of the inventive concept.

Referring to FIG. 8, a semiconductor package 40 may include more memory dies MD than the memory dies MD in the semiconductor package 10 described with reference to FIG. 1. As an example, the total dumber of the memory dies MD and semiconductor dies SD1 and SD2, which are stacked on the buffer die BD, may be 8 to 64. In the case where the number of the memory dies MD is increased, the number of the computing blocks CK, which are required in the semiconductor package 40, may be increased. Accordingly, the semiconductor package 40 may include at least two semiconductor dies SD1 and SD2, which are stacked on the memory dies MD.

The semiconductor dies SD1 and SD2 may include a first semiconductor die SD1, which is disposed on the memory dies MD, and a second semiconductor die SD2 disposed on the first semiconductor die SD1. FIG. 8 illustrates an example, in which two semiconductor dies SD1 and SD2 are included, but the inventive concept is not necessarily limited to this example. One or at least three semiconductor dies SD1 and SD2 may be included, depending on the number of the required computing blocks CK. Each of the first and second semiconductor dies SD1 and may grave substantially the same features as the semiconductor die SD described with reference to FIGS. 1 and 2.

The first semiconductor die SD1 may include the first layer LA1 and the second layer LA2.

The first layer LA1 of the first semiconductor die SD1 may include the second semiconductor substrate SS2, the second circuit layer CL2, and the second penetration electrodes TSV2. The second semiconductor substrate SS2 may be a wafer-level semiconductor substrate, which is formed of a semiconductor material (e.g., silicon (Si)). The second circuit layer CL2 may be disposed on a top surface of the second semiconductor substrate SS2. The second penetration electrodes TSV2 may penetrate the first layer LA1 in a direction perpendicular to the first layer LA1. The second penetration electrodes TSV2 and the second circuit layer CL2 may be electrically connected to each other. The second lower conductive pads LCP2 may be disposed at a lower level of the first layer LA1. The second upper conductive pads UCP2 may be disposed at an upper level of the first layer LA1.

The second layer LA2 of the first semiconductor die SD1 may be disposed on the first layer LA1. The second layer LA2 may include the third semiconductor substrate SS3, the third circuit layer CL3, and third penetration electrodes TSV3. The third semiconductor substrate SS3 may be a wafer-level semiconductor substrate, which is formed of a semiconductor material (e.g., silicon (Si)). The third circuit layer CL3 may be disposed on a bottom surface of the third semiconductor substrate SS3. The third penetration electrodes TSV3 may penetrate the second layer LA2 in a direction perpendicular to the second layer LA2. The third penetration electrodes TSV3 and the third circuit layer CL3 may be electrically connected to each other. The third penetration electrodes TSV3 may be formed of or may include at least one of metallic materials (e.g., copper (Cu), aluminum (Al), or tungsten (W)). The third penetration electrodes TSV3 may be spaced apart from the third semiconductor substrate SS3 by a third via insulating layer TVD3. The third via insulating layer TVD3 may be formed of or may include at least one of silicon oxide (SiO), silicon nitride (SiN), or silicon oxynitride (SiON) and may have a single- or multi-layered structure. Alternatively, the third via insulating layer TVD3 may include an air gap region. The third lower conductive pads LCP3 may be disposed at a lower level of the second layer LA2. Third upper conductive pads UCP3 may be disposed at an upper level of the second layer LA2. The third upper conductive pads UCP3 may be in contact with or overlapped with the third penetration electrodes TSV3. The third lower conductive pads LCP3 and the third upper conductive pads UCP3 may be formed of or may include at least one of metallic materials (e.g., copper (Cu), gold (Au), nickel (Ni), tin (Sn), silver (Ag), tungsten (W), and aluminum (Al)).

The second semiconductor die SD2 may be disposed on the first semiconductor die SD1. The second semiconductor die SD2 may include the first layer LA1 and the second layer LA2.

The first layer LA1 of the second semiconductor die SD2 may include the second semiconductor substrate SS2, the second circuit layer CL2, and the second penetration electrodes TSV2. The second semiconductor substrate SS2 may be a wafer-level semiconductor substrate, which is formed of a semiconductor material (e.g., silicon (Si)). The second circuit layer CL2 may be disposed on the top surface of the second semiconductor substrate SS2. The second penetration electrodes TSV2 may penetrate the first layer LA1 in a direction perpendicular to the first layer LA1. The second penetration electrodes TSV2 and the second circuit layer CL2 may be electrically connected to each other. The second lower conductive pads LCP2 may be disposed at a lower level of the first layer LA1. The second upper conductive pads LCP2 may be disposed at an upper level of the first layer LA1.

The second layer LA2 of the second semiconductor die SD2 may be disposed on the first layer LA1. The second semiconductor die SD2 may be a semiconductor die, which is located at the topmost level. The second layer LA2 may include the third semiconductor substrate SS3 and the third circuit layer CL3. For example, the second semiconductor die SD2 might not include the third penetration electrodes TSV3 and the third upper conductive pads UCP3, when compared with the first semiconductor die SD1. The third semiconductor substrate SS3 may be a wafer-level semiconductor substrate, which is formed of a semiconductor material (e.g., silicon (Si)). The third circuit layer CL3 may be disposed on a bottom surface of the third semiconductor substrate SS3. The third lower conductive pads LCP3 may be disposed at a lower level of the second layer LA2.

A thickness of the second layer LA2 of the second semiconductor die SD2 may be larger than a thickness of the second layer LA2 of the first semiconductor die SD1. For example, a thickness of the third semiconductor substrate SS3 of the second layer LA2 of the second semiconductor die SD2 may be larger than a thickness of the third semiconductor substrate SS3 of the second layer LA2 of the first semiconductor die SD1. Since the third semiconductor substrate SS3 of the second layer LA2 of the second semiconductor die SD2 located at the topmost level has a large thickness, heat, which is generated in the second layer LA2, may be more easily dissipated to the outside through the third semiconductor substrate SS3 of the second semiconductor die SD2.

The second die bumps CT2 may be disposed on a bottom surface of the second semiconductor die SD2. On the bottom surface of the second semiconductor die SD2, the second die bumps CT2 may be coupled to the second lower conductive pads LCP2 of the first layer LA1 of the second semiconductor die SD2. The second die bumps CT2 between the first and second semiconductor dies SD1 and SD2 may electrically connect the second semiconductor die SD2 to the first semiconductor die SD1. For example, the second die bumps CT2 may connect the second lower conductive pads LCP2 of the second semiconductor die SD2 to the third upper conductive pads UCP3 of the first semiconductor die SD1.

Figure 9:
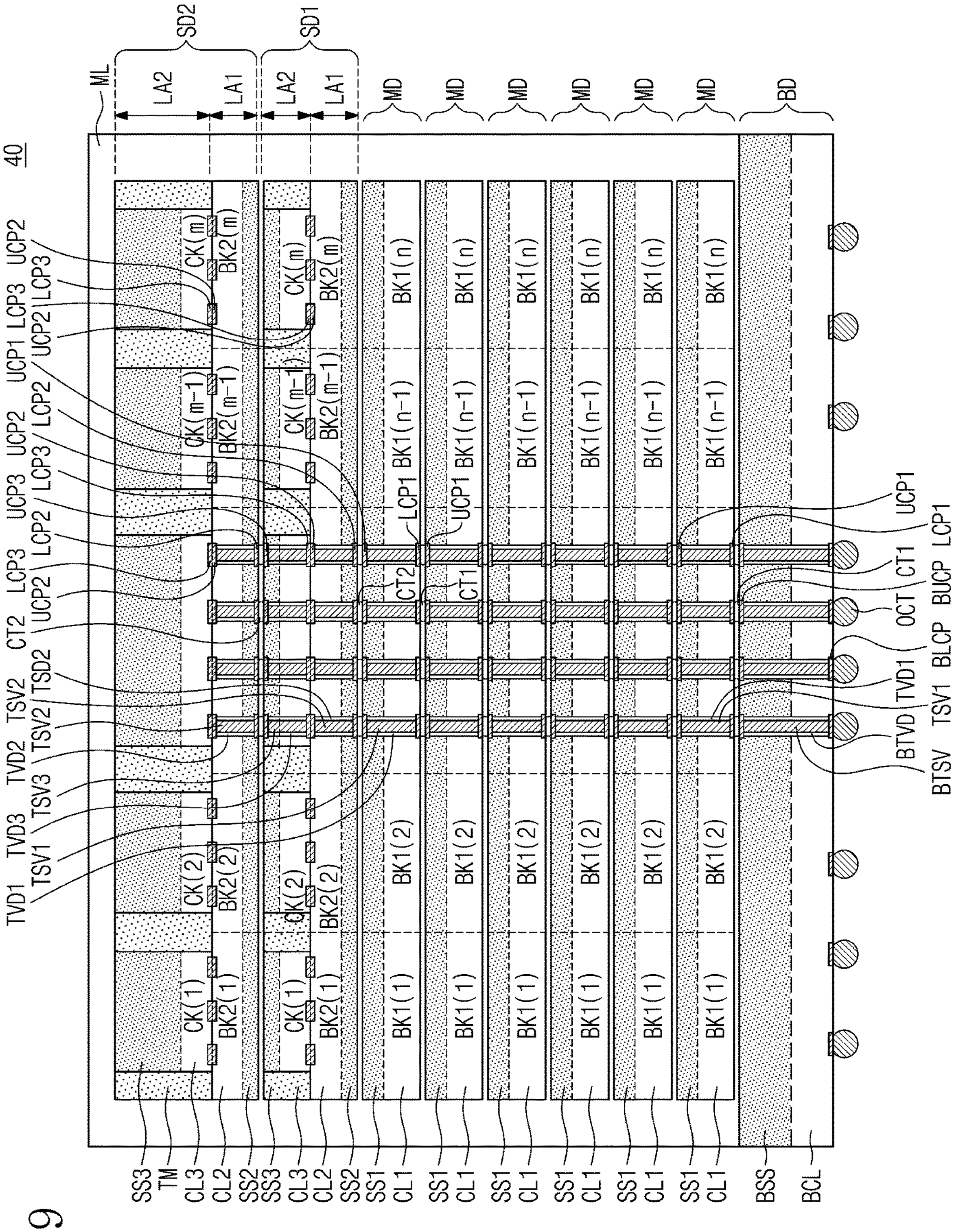

FIG. 9 is a cross-sectional view illustrating a semiconductor package according to an embodiment of the inventive concept.

FIG. 8 illustrates an example, in which the second layer LA2 in each of the first and second semiconductor dies SD1 and SD2 include the computing blocks CK formed on one third semiconductor substrate SS3, but the inventive concept is not necessarily limited to this example.

Referring to FIG. 9, the second layer LA2 of each of the first and second semiconductor dies SD1 and SD2 may include a plurality of the unit logic dies ULD. Each of the unit logic dies ULD may include the third semiconductor substrate SS3 and the third circuit layer CL3. The unit logic dies ULD may have substantially the same or similar features as the unit logic dies ULD described with reference to FIGS. 6 and 7. Here, a thickness of the unit logic dies ULD of the second semiconductor die SD2 may be larger than a thickness of the unit logic dies ULD of the first semiconductor die SD1. For example, the third semiconductor substrate SS3 of the unit logic dies ULD of the second semiconductor die SD2 may be thicker than the third semiconductor substrate SS3 of the unit logic dies ULD of the first semiconductor die SD1.

One of the second layers LA2 of the first semiconductor die SD1 may further include the third penetration electrodes TSV3. The third penetration electrodes TSV3 may penetrate the one of the second layers LA2 in a direction perpendicular to one of the second layers LA2. The third penetration electrodes TSV3 and the third circuit layer CL3 of one of the second layers LA2 may be electrically connected to each other. The third penetration electrodes TSV3 may be formed of or may include at least one of metallic materials (e.g., copper (Cu), aluminum (Al), or tungsten (W)). The third penetration electrodes TSV3 may be spaced apart from the third semiconductor substrate SS3 by the third via insulating layer TVD3. The third via insulating layer TVD3 may be formed of or may include at least one of silicon oxide (SiO), silicon nitride (SiN), or silicon oxynitride (SiON) and may have a single- or multi-layered structure. Alternatively, the third is insulating layer TVD3 may include an air gap region. The third upper conductive pads UCP3 may be disposed at the top level of the one of the second layers LA2. The third upper conductive pads UCP3 of the one of the second layers LA2 may be in contact with or overlapped with the third penetration electrodes TSV3. The third lower conductive pads LCP3 and the third upper conductive pads UCP3 may be formed of or may include at least one of metallic materials (e.g., copper (Cu), gold (Au), nickel (Ni), tin (Sn), silver (Au), tungsten (W), and aluminum (Al)).

The heat dissipation element TM may be disposed on the first layer LA1 of each of the first and second semiconductor dies SD1 and SD2. In the first and second semiconductor dies SD1 and SD2, the heat dissipation element TM may surround the unit logic dies ULD and to fill a space between the unit logic dies ULD. The heat dissipation element TM may be formed of or may include at least one of materials having high thermal conductivities.

Figure 10:
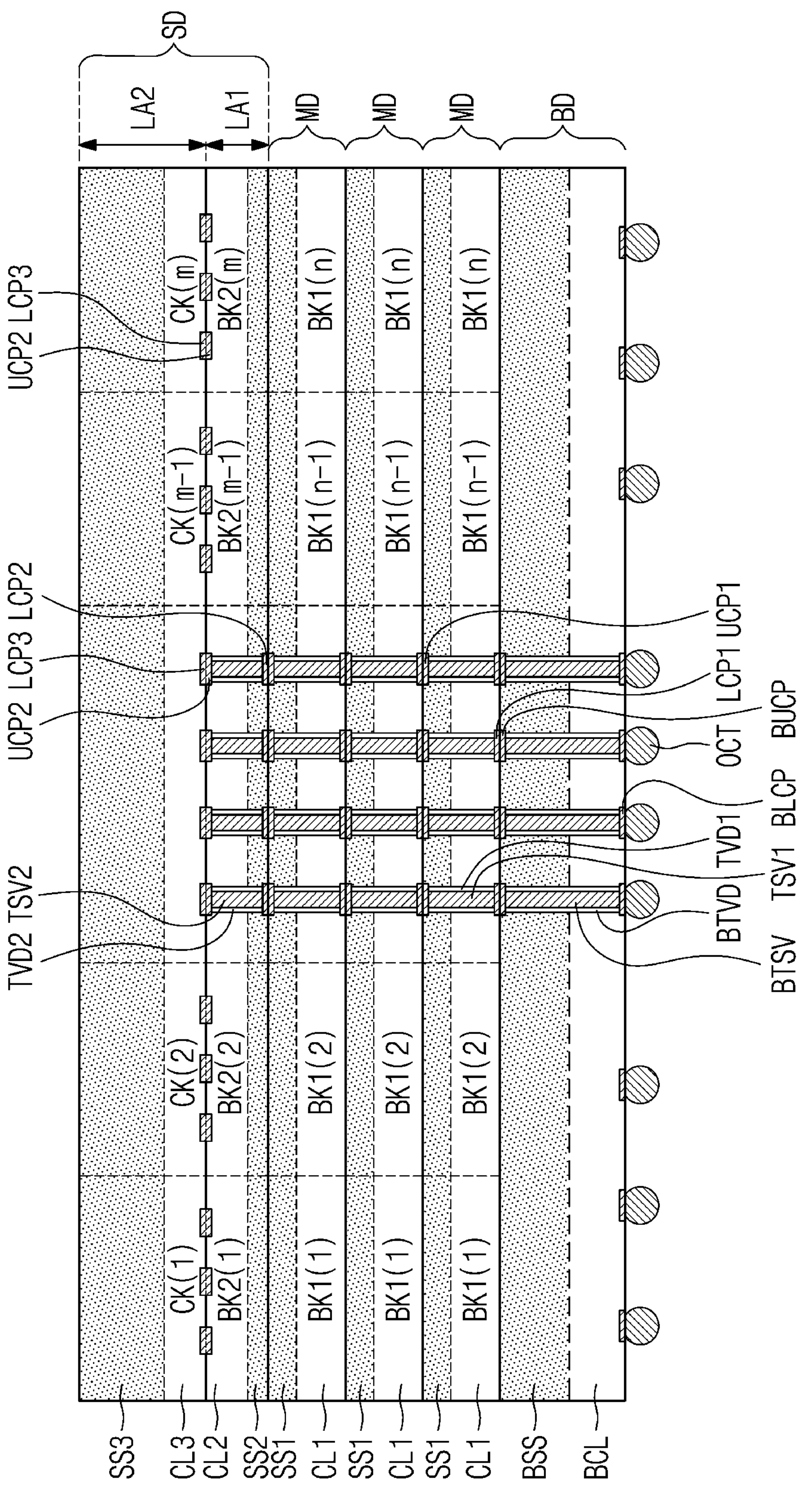

FIG. 10 is a cross-sectional view illustrating a semiconductor package according to an embodiment of the inventive concept.

Referring to FIG. 10, a semiconductor package 60 might not include the die bumps CT1 and CT2 and the mold layer ML of the semiconductor package 10 of FIG. 1.

The memory dies MD may be disposed on the buffer die BD. Widths of the memory dies MD may be equal to a width of the buffer die BD.

The lowermost one of the memory dies MD may be mounted on the buffer die BD. The lowermost memory die MD may be bonded to the buffer die BD. The lowermost memory die MD and the buffer die BD may form the hybrid bonding structure. For example, the base upper conductive pads BUCP of the buffer die BD and the first lower conductive pads LCP1 of the lowermost memory die MD may form a continuous structure, and thus, there may be no observable interface between the base upper conductive pads BUCP and the first lower conductive pads LCP1. For example, since, at a boundary between the base semiconductor substrate BSS of the buffer die BD and the first circuit layer CL1 of the lowermost memory die MD, the base upper conductive pads BUCP and the first lower conductive pads LCP1, which are in contact with each other, are formed of the same material, there may be no observable interface between the base upper conductive pads BUCP and the first lower conductive pads LCP1. For example, the base upper conductive pad BUCP and the first lower conductive pad LCP1 may together be a single element. Accordingly, the base upper conductive pads BUCP and the first lower conductive pads LCP1 may form a continuous structure. The buffer die BD and the lowermost memory die MD may be electrically connected to each other through the base upper conductive pad BUCP and the first lower conductive pad LCP1.

Other memory dies MD may be stacked on the lowermost memory die MD. The memory dies MD may form the hybrid bonding structure. For example, the first upper conductive pads UCP1 of one of the memory dies MD and the first lower conductive pads LCP1 of an adjacent one of the memory dies MD may form a continuous structure, and thus, there may be no observable interface between the first upper conductive pads UCP1 and the first lower conductive pads LCP1, which are in contact with each other. For example, the first upper conductive pad UCP1 and the first lower conductive pad LCP1, which are in contact with each other, may together be a single element, and the first upper conductive pad UCP1 and the first lower conductive pad LCP1, which are in contact with each other, may form a continuous structure. The memory dies MD, which are adjacent to each other, may be electrically connected to each other through the first upper conductive pad UCP1 and the first lower conductive pad LCP1, which are in contact with each other.

The semiconductor die SD may be stacked on the uppermost memory die MD. The uppermost memory die MD and the semiconductor die SD may form the hybrid bonding structure. For example, the first upper conductive pads UCP1 of the uppermost memory die MD and the second lower conductive pads LCP2 of the semiconductor die SD may form a continuous structure, and thus, there may be no observable interface between the first upper conductive pads UCP1 and the second lower conductive pads LCP2, which are in contact with each other. For example, the first upper conductive pad UCP1 and the second lower conductive pad LCP2, which are in contact with each other, may together be a single element, and the first upper conductive pad UCP1 and the second lower conductive pad LCP2, which are in contact with each other, may form a continuous structure. The uppermost memory die MD and the semiconductor die SD may be electrically connected to each other through the first upper conductive pad UCP1 and the second lower conductive pad LCP2, which are in contact with each other.

Figure 11:
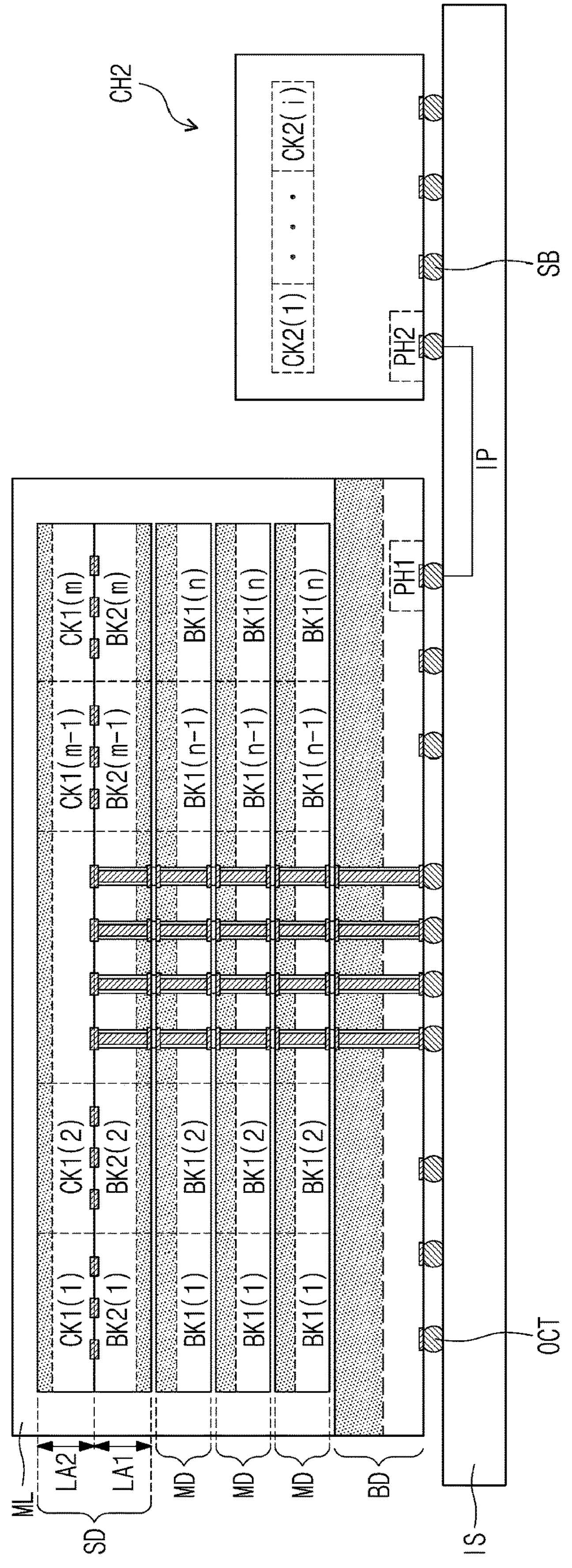

FIG. 11 is a cross-sectional view illustrating a semiconductor package according to an embodiment of the inventive concept.

Referring to FIG. 11, a semiconductor package may include a first semiconductor chip CH1 and a second semiconductor chip CH2, which are mounted on an interposer substrate IS and are disposed side by side. The first semiconductor chip CH1 may have the same or similar structure as the semiconductor package 10 described with reference to FIG. 1. Alternatively, the first semiconductor chip CH1 may have the same or similar structure as one of the semiconductor packages 10, 20, 30, 40, 50, and 60 described with reference to FIGS. 2 to 10. For example, the first semiconductor chip CH1 may include the memory dies MD, which are stacked on the buffer die BD, and the semiconductor the SD, which is disposed on the memory dies MD. The memory dies MD may have the first memory blocks BK1. The semiconductor die SD may include the first layer LA1 with the second memory blocks BK2 and the second layer LA2 with first computing blocks CK1. In the first semiconductor chip CH1, the memory and semiconductor dies MD and SD may have side surfaces that are not aligned to side surfaces of the buffer die BD. Widths of the memory dies MD and a width of the semiconductor die SD may be smaller than a width of the buffer die BD. The buffer die BD may have a first physical layer region PHY1. The first semiconductor chip CH1 may be connected to the interposer substrate IS through the outer connection terminals OCT. The interposer substrate IS may be referred to as a package substrate.

The second semiconductor chip CH2 may be connected to the interposer substrate IS through chip connection members SB. The second semiconductor chip CH2 may be a system-on-chip. The second semiconductor chip CH2 may be referred to as a host or an application processor (AP). The second semiconductor chip CH2 may be referred to as a 'computing die'. The second semiconductor chip CH2 may include a memory controller, which is used to control the memory and semiconductor dies MD and SD and to perform data input/output operations on the memory and semiconductor dies MD and SD. The memory controller may access the memory and semiconductor dies MD and SD in a direct memory access (DMA) manner. The second semiconductor chip CH2 may have a second physical layer region PHY2. The second semiconductor chip CH2 may include i second computing blocks CK2. The number i may be a positive integer. The number i may be equal to or different from the number n or m. The interposer substrate IS may include internal wires IP connecting the first physical layer region PHY1 to the second physical layer region PHY2.

The second computing blocks CK2 of the second semiconductor chip CH2 may include one or more computing units. The computing units may perform specific operations, such as max pooling, rectified linear unit (ReLU), channel-wise addition operations. The second computing blocks CK2 of the second semiconductor chip CH2 may process data, which are received from the first memory blocks BK1 of the memory dies MD, and then to store the result into respective ones of the first memory blocks BK1 of the memory dies MD.

In a semiconductor package, according to an embodiment of the inventive concept, a first layer serving as a memory element and a second layer serving as a processor element may be disposed in a single semiconductor die and may have active surfaces that are in contact with each other, and second memory blocks of the first layer may be directly connected to computing blocks of the second layer at their corresponding positions. Thus, it may be possible to reduce lengths of signal transmission paths between the second memory blocks of the first layer and the computing blocks of the second layer and thereby to increase process and operation speeds of the semiconductor die.

Furthermore, since the semiconductor die is disposed on memory dies and the second layer, which is used as the processor element in the semiconductor die, is disposed on the first layer serving as the memory element, heat, which is generated in the computing blocks of the second layer, may be easily dissipated to the outside through a third semiconductor substrate. Accordingly, it play be possible to realize a semiconductor package with an increased heat-dissipation property.

While example embodiments of the inventive concept have been particularly shown and described, it will be understood by one of ordinary skill in the art that variations in form and detail may be made therein without departing from the spirit and scope of present disclosure.

What is claimed is:

1. A semiconductor package, comprising:

a buffer die;

one or more first semiconductor dies stacked on the buffer die such that active surfaces of the one or more first semiconductor dies face the buffer die; and a second semiconductor die stacked on the one or more first semiconductor dies, wherein the second semiconductor die comprises a first layer and a second layer disposed on the first layer, wherein, the first layer comprises:

a first semiconductor substrate;

a plurality of first memory blocks disposed on a surface of the first semiconductor substrate; and a first penetration electrode, vertically penetrating the first semiconductor substrate and connected to the plurality of first memory blocks, wherein the second layer comprises:

a second semiconductor substrate; and a plurality of computing blocks disposed on a surface of the second semiconductor substrate, wherein an active surface of the first layer and an active surface of the second layer are in contact with each other, and wherein a first pad of the plurality of first memory blocks and a second pad of the plurality of computing blocks are in contact with each other.

2. The semiconductor package of claim 1, wherein a width of the second layer is equal to a width of the first layer.

3. The semiconductor package of claim 1, wherein a width of the second layer is smaller than a width of the first layer, and wherein the second semiconductor die further comprises a heat dissipation element, which is disposed on the first layer and at a side of the second layer.

4. The semiconductor package of claim 3, wherein the heat dissipation element is disposed at two opposite sides of the second layer and/or surrounds the second layer.

5. The semiconductor package of claim 3, wherein the second layer is one of a plurality of second layers, and wherein the heat dissipation element fills a space between the second layers.

6. The semiconductor package of claim 1, wherein a thickness of the second layer is larger than a thickness of the first layer.

7. The semiconductor package of claim 1, wherein the second semiconductor die is one of a plurality of second semiconductor dies, wherein the plurality of second semiconductor dies are stacked on the one or more first semiconductor dies, and wherein the second layer of each of the plurality of second semiconductor dies further comprises a third penetration electrode vertically penetrating the second semiconductor substrate.

8. The semiconductor package of claim 7, wherein a thickness of the second layer of an uppermost one of the plurality of second semiconductor dies is larger than thicknesses of the second layers of others of the plurality of second semiconductor dies.

9. The semiconductor package of claim 1, wherein the first pad of the plurality of first memory blocks and the second pad of the plurality of computing blocks are in contact with each other, and wherein the first pad and the second pad form a single element made of a same material.

10. The semiconductor package of claim 1, wherein each of the one or more first semiconductor dies comprises:

a third semiconductor substrate;

a plurality of second memory blocks disposed on a bottom surface of the third semiconductor substrate; and a fourth penetration electrode vertically penetrating the third semiconductor substrate, wherein a third pad of the second memory block of the one or more first semiconductor dies faces the buffer die.

11. The semiconductor package of claim 1, wherein the one or more first semiconductor dies and the second semiconductor die are connected to each other by a connection terminal disposed therebetween.

12. The semiconductor package of claim 1, wherein a first back-side pad, which is disposed on an inactive surface of the uppermost one of the one or more first semiconductor dies, is directly connected to a second back-side pad, which is disposed on an inactive surface of the first layer of the second semiconductor die.

13. A semiconductor package, comprising:
a buffer die;
one or more first semiconductor dies stacked on the buffer die, each of the one or more first semiconductor dies comprising a plurality of first memory blocks and having a first penetration electrode vertically penetrating the one or more first semiconductor dies; and
a second semiconductor die stacked on the one or more first semiconductor dies,
wherein the second semiconductor die comprises:
a first semiconductor substrate;
a plurality of second memory blocks disposed on a top surface of the first semiconductor substrate;
a second semiconductor substrate disposed on the first semiconductor substrate;
a plurality of computing blocks disposed on a bottom surface of the second semiconductor substrate; and
a second penetration electrode vertically penetrating the first semiconductor substrate and connected to the plurality of second memory blocks and/or the plurality of computing blocks,
wherein a first pad of the plurality of second memory blocks and a second pad of the plurality of computing blocks are directly connected to each other, and
wherein the one or more first semiconductor dies are electrically connected to each other through a connection terminal disposed therebetween.

* * * * *